(12) United States Patent
Courduvelis

(10) Patent No.: US 6,569,491 B1
(45) Date of Patent: May 27, 2003

(54) PLATABLE DIELECTRIC MATERIALS FOR MICROVIA TECHNOLOGY

(75) Inventor: Constantine I. Courduvelis, Orange, CT (US)

(73) Assignee: Enthone Inc., West Haven, CT (US)

( * ) Notice: Subject to any disclaimer, the term of this patent is extended or adjusted under 35 U.S.C. 154(b) by 207 days.

(21) Appl. No.: 09/634,198

(22) Filed: Aug. 9, 2000

(51) Int. Cl.$^7$ ............... B05D 5/12; H05K 3/00
(52) U.S. Cl. .......... 427/98; 427/305; 205/126; 205/187
(58) Field of Search ............ 427/96, 98, 304, 427/305, 402; 430/280, 312; 205/125, 126, 187

(56) References Cited

U.S. PATENT DOCUMENTS

| | | | |
|---|---|---|---|
| 4,582,564 A | * | 4/1986 | Shanefield et al. ......... 156/643 |
| 4,628,022 A | | 12/1986 | Ors et al. |
| 4,853,277 A | * | 8/1989 | Chant .................. 428/209 |
| 5,100,767 A | | 3/1992 | Yanagawa et al. |
| 5,545,510 A | | 8/1996 | Kukanskis et al. |

FOREIGN PATENT DOCUMENTS

| | | | |
|---|---|---|---|
| JP | 61848 | * | 3/1986 |
| JP | 61-61848 | | 3/1986 |
| JP | 15831 | * | 1/1988 |
| JP | 63-15831 | | 1/1988 |

* cited by examiner

*Primary Examiner*—Brian K. Talbot
(74) *Attorney, Agent, or Firm*—Senniger, Powers, Leavitt & Roedel

(57) ABSTRACT

A dielectric coating for a circuit board which is adherent to electroless copper. The coating is an epoxy dielectric including an amount of a solubilized nitrile-free butadiene or isoprene agent for promoting adhesion of an electroless copper coating. A method for producing a circuit board is also disclosed.

6 Claims, No Drawings

PLATABLE DIELECTRIC MATERIALS FOR MICROVIA TECHNOLOGY

BACKGROUND OF THE INVENTION

The present invention relates to dielectric coatings for circuit boards which provide adequate adhesion of copper plate. More particularly, the present invention relates to dielectric materials blended with polybutadiene or polyisoprene which are useful in microvia high density printed circuit boards.

Over the years with changes in sophistication of electrical equipment, manufacturers of printed circuit boards have increasingly been forced into producing high density circuits into smaller packages. In some of the most recent advances, high interconnect density on printed circuit boards is provided by utilizing multi-layer circuits which are separated by a dielectric material. These circuits are interconnected by a high density of holes or vias in the dielectric forming pads, sometimes as much as 100–200 pads per square inch. The formation of such pads may be accomplished by coating an existing circuit board surface having copper leads with a thin layer of dielectric material (i.e., 1–3 thousandths of an inch thick). Thereafter, holes (vias) are drilled with a laser or the like through the dielectric to the copper leads. In order to form a second circuit layer and/or via pads, an electroless copper deposition process is used to coat the dielectric material. This also enters the vias and attaches to the underlying copper leads. Thereafter, an electroplated copper is deposited onto the electroless copper and the printed circuit board can be imaged and etched to provide a new circuit board layer.

These vias may also be produced using photo imaging dielectrics. In this process, rather than drilling holes for via pads with a laser, the holes are imaged in the photo imageable dielectric and developed leaving the vias for forming via pads. Again, electroless copper is plated, followed by electroplated copper, which may be etched to form a circuit if desired. Photoimageable microvia technology is discussed in the article entitled "Photo Defined Vias Enable High Density Design", McDermott, Electronic Packaging and Production, May 1996, p. 45.

While such processes are known, the present dielectric resins used have been found less than adequate for providing adhesion between the electroless copper plates and the dielectric material which is necessary in these microvia applications. Typical known dielectrics are thermoset epoxies when laser drilling of vias is used. Photo imageable dielectrics may be a combination of thermosettable epoxy and photo setting epoxy acrylates.

Electroless plating onto plastic materials has been known in the art for many years. A typical process includes oxidizing of acrylonitrile butadiene styrene (ABS) plastic moldings. This is typically accomplished in a moderately hot chrome sulfuric acid solution. Typically, the polymers used in the ABS blend are acrylonitrile-butadiene-styrene, styrene-butadiene-rubber blended with acrylonitrile-styrene plastic. It is believed that the oxidant attacks the carbon-carbon double bond of the styrene butadiene based rubber to roughen the surface, which allows the electroless copper to adhere to the surface. The acrylonitrile copolymers are very polar. As stated above, circuit board dielectrics are generally either epoxy compositions or epoxy acrylate based compositions which are of relatively low polarity. In attempts to make these epoxy dielectric resins platable with electroless copper, it has been taught that nitrile rubbers were used in order to render these dielectric materials platable.

An example of the use of the nitrile rubber and its incompatibility with the dielectrics used in the printed circuits applications is U.S. Pat. No. 4,628,022, wherein dicarboxy terminated acrylonitrile-butadiene copolymers (nitrile rubbers) are reacted with epoxy and acrylic acid in order to make this polar material compatible with the low polarity epoxy and acrylic resins used as dielectric materials for printed circuit boards. Such reaction products mixed in the formula make the blend platable after oxidative treatment in a conventional 3-step permanganate process.

U.S. Pat. No. 5,545,510, issued Aug. 13, 1996 to Kukanskis (Mac Dermid, Inc.), discloses compositions containing at least one elastomer selected from the group consisting of copolymers of butadiene with acrylonitrile, carboxy terminated butadiene acrylonitrile and epoxy terminated butadiene acrylonitrile copolymers. The adhesion values reported are 0.5, 3.0 and 4.8 lbs/inch.

Nitrile rubbers separate in phases and were found to be incompatible. Therefore, it has been desirable in the art to provide an improved dielectric material which has superior adhesion properties but which is usable within regularly known epoxy dielectric compositions. These dielectric compositions preferably may be cured to a hard consistency and have a high glass transition temperature, low dielectric constant and low dissipation factor. Additionally, it is preferable to provide a dielectric material which is highly adherent to electroless copper in conventional oxidative processes which provides good adhesion of the plated metal.

SUMMARY OF THE INVENTION

In accordance with the present invention, there is provided a dielectric coating for a circuit board for providing good adherent characteristics for electroless copper. The dielectric coating comprises an aqueous developing epoxy composition, including an amount of butadiene or isoprene modifying agent effective for promoting adhesion of an electroless copper coating. The additives of the present invention must be soluble in the particular epoxy dielectric material utilized. Thus, because of the negative effect of high polarity compositions such as nitrites, this composition is a nitrile-free butadiene or isoprene-type composition.

Further understanding of the present invention will be had by reference to the detailed description of the preferred embodiments set forth below when taken in conjunction with the examples and claims appended hereto.

DETAILED DESCRIPTION OF THE PREFERRED EMBODIMENTS

In accordance with the present invention, there is provided a dielectric coating for a circuit board for providing good adherent characteristics for electroless copper. In its broad aspects, the present invention comprises an epoxy dielectric composition including an amount of a nitrile-free butadiene or isoprene agent. This agent is effective for promoting adhesion of an electroless copper coating. The butadiene or isoprene agent is solubilized in the epoxy dielectric. In accordance with the method aspects of the present invention, a method of producing a multi-layered printed circuit board is provided, which comprises the steps of first providing a circuit board substrate which includes a surface which has circuitry printed thereon. Next, the surface of the board is coated with an effective amount of a solution of a dielectric material comprising an epoxy resin, and an effective amount of a butadiene or isoprene polymer adhesion promoter. Thereafter, the coating is freed from solvent by heating and baking, and textured by permanganate oxidation, and an electroless copper layer is plated onto the coating, followed by electroplated copper.

The board is then imaged by dry film imaging, primary image and unwanted copper is removed to leave vias and circuits. The dielectric material typically includes epoxy resin-type dielectrics, which are known in the art, with a mixture of from about 2% to about 15%, and preferably 4% to 8% of an adhesion promoter. Typically, such epoxy dielectrics include epoxy resins, epoxy curing agents, rheological additives and mineral fillers. These dielectrics are typically applied in 60–85% by weight solutions in glycol ethers or similar solvents. The nitrile-free butadiene or isoprene polymer adhesion promoters are critical to the present invention. These adhesion promoters, without nitrile groups in the molecule, are polarity compatible with the relatively nonpolar epoxy compositions. Thus, they are soluble in the same types of systems as the epoxies. Thus, the absence of nitrile groups is essential to the present invention in order to provide proper solubility in dielectric compositions of the present invention.

Suitable thermoset epoxy systems used with the present invention are those commonly known in the art. These include epoxy type resins as follows: epoxy novolacs, like Araldite EPN-1138, -1139, cresol novolacs, like Araldite ECN-1235, -1237, -1299, tris-phenol epoxy type, like Tactix-742, -740, 2,3-epoxypropyl isocyanurate, etc., all from Ciba, Specialty Chemicals Corporation.

Suitable epoxy curing agents include the following: melamine (1,3,5-triamino-S-triazine), DICY (dicyan diamide), etc., epoxy curing agent modifiers, like Aneamine 2441, a modified polyamine proprietary from Air Products, imidazoles, like 2-mercaptobenzimidazole, ethyl methyl imidazole, etc.

Typically, such compositions include rheological additives such as the following: polydimethylsiloxanes, such as TSA-750; surfactants, such as Fluorad FC-430 (3 M Co); polyacrylates, such as Modaflow (Monsato); and mixtures of these.

Also, mineral fillers may be utilized as desired. Suitable mineral fillers include the following: fumed silicas, like aerosil 380, 200, R-974 (Degussa), hydrated alumina, mined silicas, like Imisil A-8, barium sulfate and clays such as Benton SD-2.

The nitrile-free butadiene or isoprene polymer adhesion promoters of the present invention may be provided by liquid polybutadienes or may also be provided in epoxy agents which are modified with polybutadienes or polyisoprenes.

The nitrile free diene polymers of the present invention are selected from the group consisting of polybutadiene, polyisoprene epoxidized polybutadiene, epoxidized polyisoprene, carboxy terminated polybutadiene or polyisoprene, carboxy terminated epoxidized polybutadiene, carboxy terminated epoxidized polyisoprene, hydroxy functionalized polybutadiene, hydroxy functionalized polyisoprene, hydroxy functionalized epoxidized polybutadiene, and hydroxy functionalized epoxidized polyisoprene. Examples of suitable adhesion promoters of the present invention include: those obtainable from Aldrich Catalog No. 38,767-3; 41,891-9; 40,620-1, 38,766-5; 38,768-1. Other suitable adhesion agents include EPOLEAD BP3600 and BP4700 obtainable from Dicel of Japan.

Thus, these materials typically are low molecular weight liquid polybutadienes in their free forms or structurally modified forms which are modified for acquiring functional groups. These materials may include polybutadiene epoxy/hydroxy functionalized or polybutadiene hydroxy functionalized or dicarboxy terminated polybutadienes. Such materials typically have a weight average molecular weight of from about 1,000 to about 10,000, with preferable weight average molecular weights including from about 1,000 to about 5,000. Suitable materials for use in the present invention may be manufactured at low cost by anionic polymerization of butadiene monomers which are catalyzed by organolithium compounds. This polymerization yields living polymers which have a molecular weight determined by the ratio of the monomer to the catalyst. These polymers may thereafter be terminated with water to form free polybutadienes or can be terminated with carbon dioxide to form carboxylic acids. Other forms might be terminated with formaldehyde or ethylene oxide to form hydroxy terminated polymers. If the material is reacted with epichlorohydrine, epoxy terminated monomers may be formed. Alternatively, reacting with organic peroxides can form epoxy groups on the backbone of the polydienes. Polyisoprene can be subjected to the same chemical processes and used as adhesion promoters in the present invention. While low molecular weight polybutadienes are typically liquid and soluble in the epoxy dielectric systems, other higher molecular weight polybutadienes and polyisoprenes may be used, provided they are soluble in a suitable solvent which is compatible with the dielectric solvent system. Typically, glycol ethers will provide suitable solubility in compounds of the present invention.

In accordance with the process aspects of the present invention, a multi-layered circuit board is produced as follows. First, a suitable printed circuit board is provided which includes a surface thereof having circuitry printed thereon. Manufacture of printed circuit boards and the like is known in the art. Additionally, the etching and formation of circuitry on such boards of copper plate is also known in the art. After the circuit has been formed on the board, the dielectric material described above is coated onto the printed circuit board. In a preferred aspect of the present invention, high interconnect density printed circuit boards are produced by providing a coating of 1–3 thousandths of an inch thick and drilling holes as much as 100–200 per square inch in the board where necessary for connection to the circuitry. Thereafter, the board is treated with an oxidizing process to texture the surface for subsequent plating of electroless copper. Oxidizing processes are known in the art and generally comprise the following. First, an aqueous solution of neutral or alkaline solvents is used to swell the dielectric material. Then an aqueous solution of potassium or sodium permanganate and sodium hydroxide is used, followed by an aqueous solution of a reducer such as hydrazine, hydroxylamine, sulfuric hydrogen peroxide or the like.

A typical process used in electroless copper plating is as follows. First, the dielectric surface is prepared prior to plating with first a cleaner or conditioner based aqueous surfactant, preferably an alkanolamine such as ethanolamine. A copper etchant solution is used to etch the surface. This etchant may be based on acidic peroxysulfates or persulfate solutions as are known in the art. A palladium based activator is then used and then a postactivator. Thereafter, electroless copper is plated onto the treated dielectric using a suitable process such as Enplate $C_u$-406, available from Enthone-OMI, Inc., West Haven, Conn.

Thereafter, an electroplated copper layer is plated onto the electroless copper. Electroplating copper solutions are known in the art. Any suitable acid copper electroplate may be used, such as XR-235, obtainable from Enthone-OMI, Inc. of West Haven, Conn.

Thereafter, the new layer of electroplated copper may be imaged and etched as is known to those skilled in the art. In the present invention, adhesion of the electroless copper layer to the dielectric coating is critical to providing high quality printed circuit boards. Adhesion in excess of 6 pounds per inch is obtainable under controlled process conditions of the present invention.

A further understanding of the present invention will be had with reference to the following examples which are set forth herein for purposes of illustration but not limitation.

EXAMPLE I

A solution of a cresol novolac epoxy was prepared by stirring at 75° C. 833 g of EPON DPS-164 (Shell Chemical) in 555 g of butoxyethyl acetate. To this was added 2320 g of a second phenol novolac epoxy resin (Araldite EPN-1138, from CIBA) which was pre-melted for 1½ hours at 75° C. This first component was mixed for 2 days until the solution stopped foaming and appeared clear and colorless.

To this mixture was added sequentially: 31.5 g 2-Mercaptobenzimidazole (stirred for 15 minutes); 32 g surfactant (Flourad FC-430) along with 32 g polydimethyl siloxane (TSA-750) (stirred for 15 minutes); 453 g micronized 2,4,6 triamino-S-triazine (stirred for 30 minutes); and, thereafter, 20.5 g silica (Aerosil R-974) (stirred for 60 minutes). The resulting solution was very viscous. 210 g butoxyethyl acetate was added to reduce viscosity. Ancamine 2441, a modified polyamine epoxy-curing agent from Air Products, 160 g was added. The resulting mixture was stirred for one hour and, thereafter, milled in a 3-roll mill.

EXAMPLE II

To the 188 g of dielectric mixture of Example 1, was added 10.9 g of an epoxy hydroxy functionalized polybutadiene (Aldrich Catalog No. 38,767-3). This mixture was diluted with 5.9 parts butoxyethyl acetate per 100 parts of the above mixture to facilitate screening. This solution was mixed for 3 minutes at between 500–1000 rpm. A first layer was screened onto a copper clad panel with an 83 mesh screen, and baked at 160° F. for 45 minutes. The coating was found to be free of debris and bubbles.

A second layer was screened over the first one and dried at 160° F. for 45 minutes in order to increase the coating thickness. Baking followed for 1.5 hours at 325° F. with ramp up of 30 minutes.

TEXTURING

Panels were textured in the following cycle of Enthone-OMI, Inc.
1. Envision® MLB-2010 (175° F., 3 min.) (a mixture of glycol ethers and NaOH).
2. 2 minute rinse.
3. Envision® MLB-2020 (176° F., 11 min) (a mixture of potassium permanganate and sodium hydroxide).
4. 2 minute rinse.
5. Envision® MLB-2030 (150° F., 4 min) (a hydroxyl amine sulfate solution).
6. 2 minute rinse.

PLATING

1. Envision® Conditioner PDD-9020, 120° F., 5 min. (5% ethanolamine).
2. Water rinse 2 min.
3. Enplate® AD-485, 92° F., 1 min. (an etchant).
4. Water rinse 2 min.
5. 10% by Vol. $H_2SO_4$, 2 min.
6. Water rinse 2 min.
7. Enplate® PC-236, 1 min. (dilute hydrochloric acid).
8. Enplate® Activator 444 (2.8%), 90° F., 5 min. (Pd—Sn catalyst initiator).
9. Water rinse 2 min.
10. Enplate® PA-493, 78° F., 3 min. (acid postactivation accelerator).
11. Water rinse 2 min.
12. Enplate® Electroless CU-406, 90° F., 30 min. (40–60 microinches).
13. Water rinse 2 min.
14. 10% Sulfuric Acid, 1 min.
15. Water rinse 2 min.
16. 30 seconds in anti-tarnish, Enplate® CU-56.
17. Bake, 200° F., 60 min.
18. Acid copper electroplate, XR-235, 25 ASF, 60 min., 1.0 mil thick.
19. Water rinse, 2 mn.
20. Panels were baked in convection oven at 340° F. for 20 minutes for heat annealing.

Another set of panels were coated and processed the same way using epoxidized polybutadiene from Dicel Corporation of Japan. The same mix ratio described on the Aldrich sample was used here, too.

SOME ADHESION VALUES

| Sample | Adhesion, lb/inch | Remarks |
| --- | --- | --- |
| Aldrich #38,767-3 | 6.8 | Copper clad panel pumiced |
| " | 6.6 | same as above with ENTEK 106 coat** |
| Dicel PB-3600* | 7.2 | Copper clad panel pumiced |
| " | 7.1 | same as above with ENTEK 106 coat |
| Dicel PB-4700* | 7.0 | Copper clad panel pumiced |
| " | 6.7 | same as above with ENTEK 106 coat |

*Epoxidized polybutadienes from Dicel of Japan
**ENTEK is copper clad surface treated in ENTEK 106, a copper preservative based on imidazole formula prior to coating of the dielectric onto the surface.

BAKING STUDIES at 325° F.

(The above mix of the Aldrich polybutadiene was subjected to studies of the epoxy-curing conditions. This is the baking after the coating is dried at 160° F.).

| Sample | Adhesion, lb/inch | Remarks |
| --- | --- | --- |
| A.-Bake 1.5 hours, No ramp up | 7.3 | Copper clad pumiced |
| " | 7.3 | same as above with ENTEK 106 |
| B.-Bake 1.5 hours, 30 min. ramp up | 7.1 | Copper clad pumiced |
| C.-" | 6.8 | same as above with ENTEK 106 |
| C.-Bake 2 hours, 30 min. ramp up | 5.6 | Copper clad pumiced |
| D.-" | 5.1 | same as above with ENTEK 106 |

GLASS TRANSITION

Sample of the Aldrich mix was screened on panel covered with a release sheet and subjected to the same process cycle through the 1½ hour baking at 325° F. The sample was tested for Tg by DSC (differential scanning calorimetry). Tg was found to be 160° C.

OTHER POLYBUTADIENES

The table below lists the evaluation of various polybutadienes going through the same process steps described above. All the samples were purchased from Aldrich Chemical Company.

Adhesion and Tg of the Samples

| Material Tested | Description | Code | Adhesion lbs/inch | Tg, ° C. |
|---|---|---|---|---|
| Polybutadiene | Mn 1500–2000 | A ENTEK*///A FR-4** | 6.1///6.5 | 133 |
| " | Mn 3000 | B ENTEK///B FR-4 | 6.1///5.6 | 171.6 |
| Polybutadiene/ Hydroxy derivatized | Mn 1200, Mw 2400, OH #1.7 meq/g | C ENTEK///C FR-4 | 5.1///4.8 | 171.2 |
| " | Mn 2,800 | E ENTEK///E FR-4 | 5.0///3.5 | |
| Polybutadiene/ Epoxyhydroxy derivatized | Mn 1,300, Mw 2,600 E.W 460 | D ENTEK///D FR-4 | 5.0///5.9 | |

Mn is number average molecular weight
Mw is weight average molecular weight
*ENTEK is copper clad surface treated in ENTEK 106, a copper preservative based on imidazole formulated prior to coating the dielectric onto the surface.
**FR-4 is a copper coated epoxy fiberglass board material.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A method of producing a multi-layered printed circuit board comprising:

providing a board including a surface thereof which has circuitry printed thereon;

coating said surface with an effective amount of a dielectric material comprising an epoxy resin and an effective amount of a nitrile-free butadiene or nitrile-free isoprene adhesion agent to produce an epoxy dielectric coating on said surface;

texturing said epoxy dielectric coating;

depositing an electroless copper layer onto said epoxy dielectric coating.

2. The method of claim 1 wherein said adhesion agent is a nitrile-free butadiene-modified or nitrile-free isoprene-modified epoxy.

3. The method of claim 2 wherein said nitrile-free butadiene-modified or nitrile-free isoprene-modified epoxy is modified with polybutadiene or polyisoprene.

4. The method of claim 3 wherein said nitrile-free butadiene-modified or nitrile-free isoprene-modified epoxy has a molecular weight of from about 1,000 to about 10,000 average molecular weight.

5. The method of claim 3 wherein said nitrile-free butadiene-modified or nitrile-free isoprene-modified epoxy has a molecular weight of from about 1000 to about 5,000 average molecular weight.

6. The method of claim 1 further comprising electroplating a copper plate onto said electroless copper layer.

* * * * *